United States Patent
Chen et al.

(10) Patent No.: US 9,508,719 B2
(45) Date of Patent: Nov. 29, 2016

(54) FIN FIELD EFFECT TRANSISTOR (FINFET) DEVICE WITH CONTROLLED END-TO-END CRITICAL DIMENSION AND METHOD FOR FORMING THE SAME

(71) Applicant: Taiwan Semiconductor Manufacturing Co., Ltd., Hsin-Chu (TW)

(72) Inventors: Chang-Yin Chen, Taipei (TW); Tung-Wen Cheng, New Taipei (TW); Che-Cheng Chang, New Taipei (TW); Chun-Lung Ni, Tainan (TW); Jr-Jung Lin, Hsinchu (TW); Chih-Han Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/554,682

(22) Filed: Nov. 26, 2014

(65) Prior Publication Data

US 2016/0148935 A1 May 26, 2016

(51) Int. Cl.
*H01L 27/092* (2006.01)
*H01L 27/088* (2006.01)
*H01L 29/06* (2006.01)
*H01L 29/51* (2006.01)
(Continued)

(52) U.S. Cl.
CPC ..... *H01L 27/0924* (2013.01); *H01L 21/02532* (2013.01); *H01L 21/02595* (2013.01); *H01L 21/0332* (2013.01); *H01L 21/0335* (2013.01); *H01L 21/0337* (2013.01); *H01L 21/31144* (2013.01); *H01L 21/32139* (2013.01); *H01L 21/823431* (2013.01); *H01L 21/823821* (2013.01); *H01L 27/0886* (2013.01); *H01L 29/0653* (2013.01); *H01L 29/495* (2013.01); *H01L 29/4966* (2013.01); *H01L 29/517* (2013.01); *H01L 21/0206* (2013.01); *H01L 21/0212* (2013.01); *H01L 21/02274* (2013.01)

(58) Field of Classification Search
CPC .......... H01L 27/0924; H01L 21/0206; H01L 21/02532; H01L 21/02595; H01L 21/0332; H01L 21/0337; H01L 21/31144; H01L 21/823431; H01L 21/823821; H01L 27/0886; H01L 29/0653; H01L 29/495; H01L 29/4966; H01L 29/517
See application file for complete search history.

(56) References Cited

U.S. PATENT DOCUMENTS 6,867,116 B1 * 3/2005 Chung ................ H01L 21/0337
257/E21.038
7,723,772 B2 5/2010 Ozawa et al.
(Continued)

FOREIGN PATENT DOCUMENTS

| KR | 1020050094576 A | 9/2005 |
| KR | 1020130025788 A | 3/2013 |
| TW | 201436052 | 9/2014 |

*Primary Examiner* — Peter Bradford
(74) *Attorney, Agent, or Firm* — Slater Matsil, LLP

(57) ABSTRACT

A fin field effect transistor (FinFET) device structure and method for forming FinFET device structure is provided. The FinFET device structure includes a substrate and a first fin structure and a second fin structure extending above the substrate. The FinFET device structure also includes a first transistor formed on the first fin structure and a second transistor formed on the second fin structure. The FinFET device structure further includes an inter-layer dielectric (ILD) structure formed in an end-to-end gap between the first transistor and the second transistor, and the end-to-end gap has a width in a range from about 20 nm to about 40 nm.

20 Claims, 11 Drawing Sheets

(51) Int. Cl.
*H01L 29/49* (2006.01)
*H01L 21/8238* (2006.01)
*H01L 21/8234* (2006.01)
*H01L 21/02* (2006.01)
*H01L 21/311* (2006.01)
*H01L 21/033* (2006.01)
*H01L 21/3213* (2006.01)

(56) References Cited

U.S. PATENT DOCUMENTS

| | | |
|---|---|---|
| 9,029,226 B2 | 5/2015 | Tsai et al. |
| 2005/0215014 A1 | 9/2005 | Ahn et al. |
| 2007/0205438 A1* | 9/2007 | Juengling .......... H01L 21/0337 257/216 |
| 2010/0018944 A1* | 1/2010 | Lai ..................... H01L 21/0273 216/13 |
| 2010/0216314 A1* | 8/2010 | Honda ................ H01L 21/0212 438/737 |
| 2012/0094495 A1* | 4/2012 | Honda ................ H01L 21/0212 438/696 |
| 2013/0056830 A1 | 3/2013 | Ko et al. |
| 2013/0062708 A1 | 3/2013 | Zhong et al. |
| 2013/0154004 A1* | 6/2013 | Liu .................... H01L 29/66795 257/347 |
| 2013/0244430 A1* | 9/2013 | Lin ........................ H01L 29/49 438/692 |
| 2014/0077295 A1* | 3/2014 | Juengling ......... H01L 21/76229 257/334 |

* cited by examiner

FIN FIELD EFFECT TRANSISTOR (FINFET) DEVICE WITH CONTROLLED END-TO-END CRITICAL DIMENSION AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
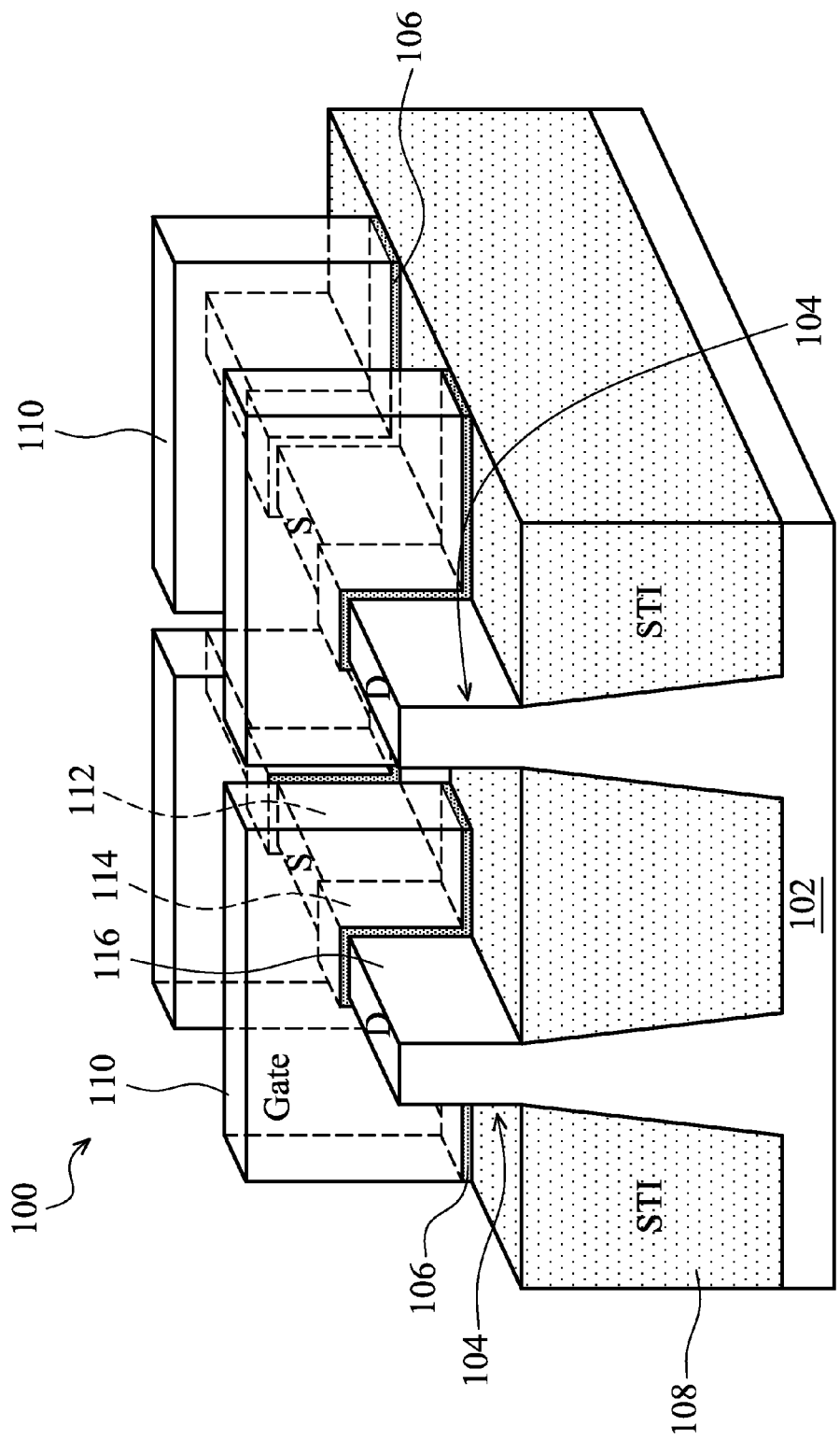
FIG. 1 shows a perspective representation of a fin field effect transistor (FinFET) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure are provided. FIG. 1A shows a perspective representation of a fin field effect transistor (FinFET) device structure 100, in accordance with some embodiments of the disclosure.

The FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

FinFET device structure 100 also includes one or more fin structures 104 (e.g., Si fins) that extend from the substrate 102. Fin structures 104 may optionally include germanium. The fin structures 104 may be formed by using suitable processes such as photolithography and etching processes. In some embodiments, the fin structures 104 are etched from the substrate 102 using dry etch or plasma processes.

An isolation structure 108, such as a shallow trench isolation (STI) structure, is formed to surround fin structures 104. In some embodiments, a lower portion of the fin structures 104 is surrounded by the isolation structure 108, and an upper portion of the fin structures 104 protrudes from the isolation structure 108, as shown in FIG. 1. In other words, a portion of the fin structures 104 is embedded in the isolation structure 108. The isolation structure 108 prevents electrical interference or crosstalk.

The FinFET device structure 100 further includes a gate stack structure including a gate electrode 110 and a gate dielectric layer 106. The gate stack structure is formed over a central portion of the fin structures 104. In some embodiments, multiple gate stack structures are formed over the fin structures 104. Numerous other layers may also be present in the gate structures, for example, capping layers, interface layers, spacer elements, and/or other suitable features.

The gate dielectric layer 106 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. The gate electrode 110 may be formed in a gate last process (or gate replacement process). In some embodiments, the gate stack structure includes additional layers, such as interfacial layers, capping layers, diffusion/barrier layers, or other applicable layers.

The fin structures 104 includes a channel region 112 surrounded or wrapped by the gate electrode 110 and the gate dielectric layer 106. The fin structures 104 may be doped to provide a suitable channel for an n-type FinFET (NMOS device) or a p-type FinFET (PMOS device). The fin structures 104 may be doped using a suitable process, such as an ion implantation process, diffusion process, annealing process, other applicable processes, or combinations thereof. The fin structures 104 include a source region 114 and a drain region 116, and the channel region 112 is between the source region 114 and the drain region 116. The FinFET device 100 may be a device included in a microprocessor, memory cell (e.g., Static Random-Access Memory (SRAM)), and/or other integrated circuits.

Figure 2:
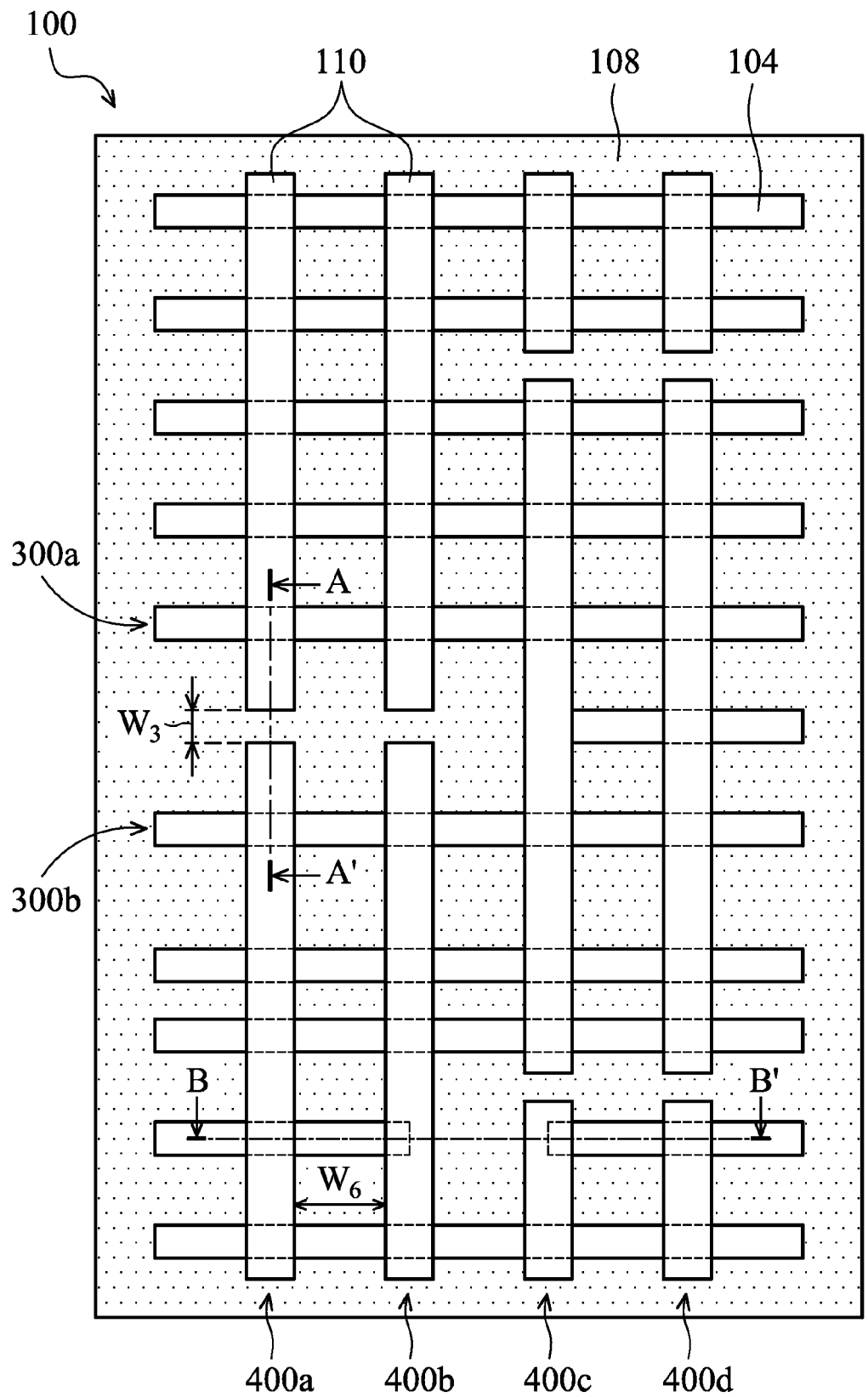
FIG. 2 shows a top-view of a fin field effect transistor (FinFET) device structure, in accordance with some embodiments of the disclosure.

FIG. 2 shows a top-view of a fin field effect transistor (FinFET) device structure 100, in accordance with some embodiments of the disclosure. The FinFET device structure 100 includes multiple fin structures 104 and multiple gate electrodes 110. The gate electrodes 110 traverse over the fin structures 104. The FinFET device structure 100 is surrounded by the isolation structure 108.

As shown in FIG. 2, the fin structures 104 may be substantially parallel to each other. The gate electrodes 110 may also be parallel to each other and substantially perpendicular to the fin structures 104. In some embodiments, the gate electrodes 110 are also called gate electrode lines when seen from a top-view.

A first transistor 300a is formed on the first fin structure 104a, and a second transistor 300b is formed on the second fin structures 104b. In some embodiments, a third width ($W_3$) between first transistor 300a and second transistor 300b is in a range from about 10 nm to about 50 nm.

FIGS. 3A-3H show cross-sectional representations of various stages of forming a fin field effect transistor (FinFET) device structure 100, in accordance with some embodiments of the disclosure. FIGS. 3A-3H are cross-sectional representations taken along line AA' of FIG. 2.

Figure 3A:
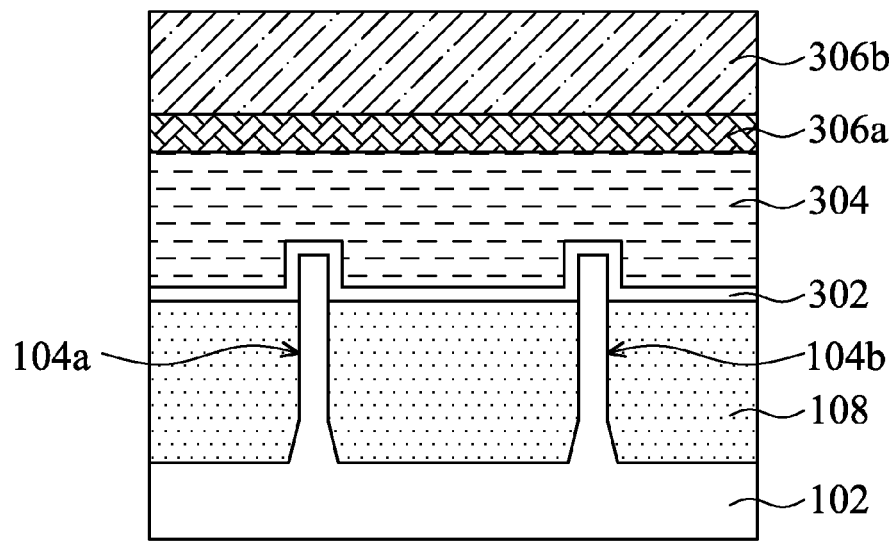
FIGS. 3A-3I show cross-sectional representations of various stages of forming a fin field effect transistor (FinFET) device structure, in accordance with some embodiments of the disclosure.

Referring to FIG. 3A, a first fin structure 104a and a second fin structure 104b are formed over the substrate 102. In some embodiments, the substrate 102 is etched to form the first fin structure 104a and the second fin structure 104b by depositing and patterning a hard mask layer (not shown) on the substrate 102. The hard mask layer forms a pattern covering a portion of the substrate 102. Afterwards, the substrate 102 is etched to form trenches between the regions covered by the hard mask layer. As a result, the first fin structures 104 and the second fin structure 104b are formed between the trenches.

Afterwards, a dielectric material (e.g., silicon oxide) is deposited into the trenches, covering the first fin structure 104a and the second fin structure 104b. The dielectric material is planarized down to the top surfaces of the first fin structure 104a and the second fin structure 104b or the hard mask layer, and then the dielectric material is etched to a level below the top surfaces of the first fin structure 104a and the second fin structure 104b. As a result, an upper portion of the first fin structures 104a and the second fin structure 104b protrudes above the isolation structure 108, and a lower portion of the first fin structure 104a and the second fin structure 104b is surrounded and covered by the isolation structure 108.

Alternatively, in some other embodiments, the isolation structure 108 is formed over the substrate 102 first. Trenches between the isolation structure 108 are formed to expose the substrate 102. A semiconductor material, such as silicon, silicon germanium, or other applicable materials, is then grown in the trenches to form the first fin structure 104a and the second fin structure 104b by using, for example, an epitaxial process. After the first fin structure 104a and the second fin structure 104b are grown to the desired height, the isolation structure 108 is etched down to a level below the top surface of the first fin structure 104a and the second fin structure 104b. As a result, a portion of the first fin structure 104a and the second fin structure 104b protrudes above the isolation structure 108.

As shown in FIG. 3A, a dielectric layer 302 and a polysilicon layer 304 are formed sequentially on the first fin structure 104a, the second fin structure 104b and isolation structure 108. Afterwards, a first hard mask layer 306a and a second hard mask layer 306b are formed over the polysilicon layer 304. The first hard mask 306a may be made of silicon oxide, silicon nitride, silicon oxynitride, or other applicable materials. The second hard mask 306b may be made of silicon oxide, silicon nitride, silicon oxynitride, or other applicable materials. The first hard mask layer 306a and the second hard mask layer 306b are formed by a patterning process. The patterning process includes a photolithography process and an etching process. Photolithography processes include photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 3B:
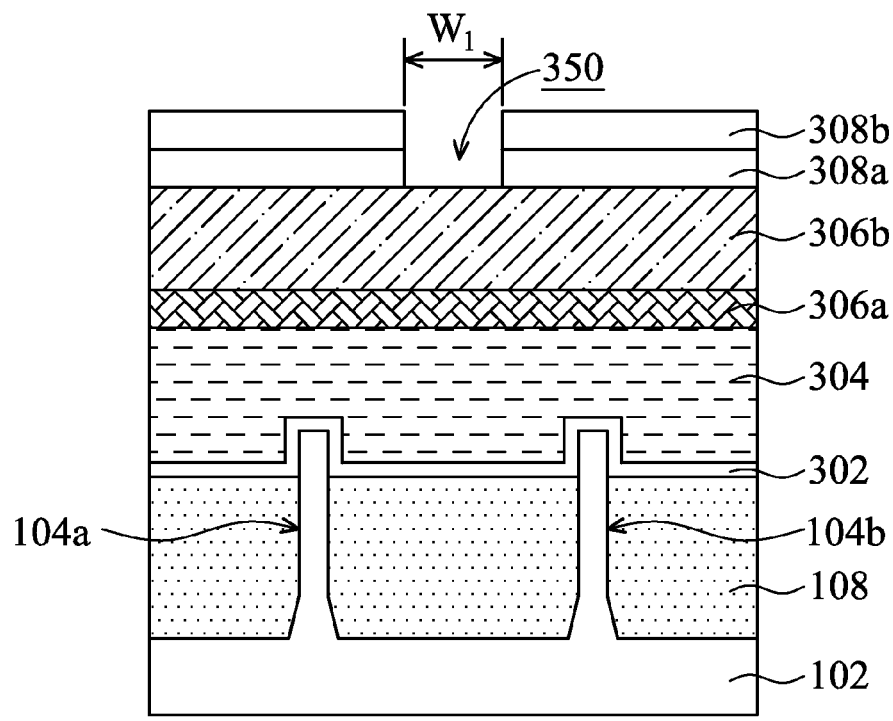

After the first hard mask layer 306a and the second hard mask layer 306b are formed, a first photoresist layer 308a and a second photoresist layer 308b are formed on the second hard mask layer 306b as shown in FIG. 3B, in accordance with some embodiments of the disclosure.

In some embodiments, the first photoresist layer 308a is a carbon-rich layer, such as silicon carbide (SiC or SixC). In some embodiments, the second photoresist layer 308b is a silicon-rich layer, such as silicon oxide (SiOx), silicon nitride (SixNy) or silicon oxynitride (SiON).

Afterwards, the first photoresist layer 308a and the second photoresist layer 308b are patterned to form a trench 350 in the first photoresist layer 308a and the second photoresist layer 308b. The trench has a first width $W_1$. In some embodiments, the first width $W_1$ is in a range from about 40 nm to about 80 nm.

Figure 3C:
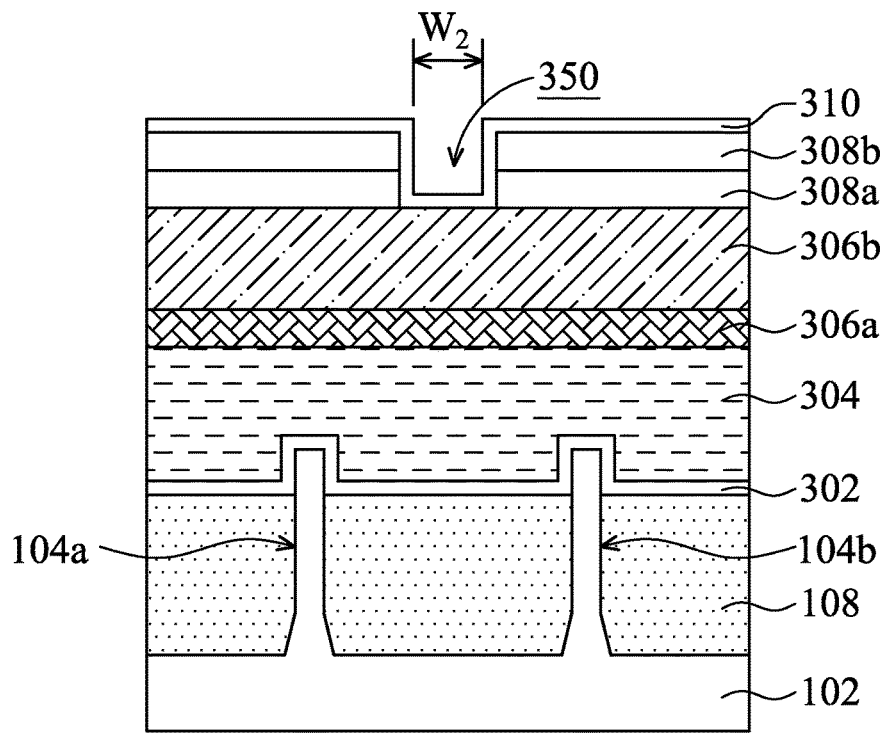

After the trench 350 is formed, a coating layer 310 is conformally formed in the trench 350 and on the second photoresist layer 308b as shown in FIG. 3C, in accordance with some embodiments of the disclosure. The coating layer 310 is a fluorine-containing polymer. The coating layer 310 is configured to reduce the width of the trench 350. After forming the coating layer 310, the trench 350 has a reduced second width $W_2$. Therefore, the second width $W_2$ is smaller than the first width $W_1$.

The coating layer 310 is formed by a coating process with a coating gas. In some embodiments, the coating process is a plasma process. The coating gas includes fluorine-containing gas, such as tetrafluoromethane ($CF_4$), difluoromethane ($CH_2F_2$), sulfur hexafluoride ($SF_6$), or nitrogen trifluoride ($NF_3$), another applicable gas or combinations thereof. The flow rate of the coating gas is in a range from about 0.1 sccm to about 100 sccm. A bias voltage used in plasma process is in a range from 0V. A power used in the plasma process is in a range from about 500 Watt to about 1500 Watt.

The coating thickness of the coating layer 310 is dependent on the coating time. The coating time is in a range from about 1 second to about 50 seconds. If the coating time is too long, the trench 350 may be completely filled with the coating layer 310, and therefore the underlying layers cannot be patterned using the pattern of the trench 350. If the coating time is too short, the coating layer 310 is too thin to reduce the dimension of the trench 350.

It should be noted that, in order to prevent some unwanted residues (coming from the photoresist layer 308a or 308b) from remaining in the trench 350, a pre-cleaning process is performed on the trench 350 before the coating layer 310 is formed. When the trench 350 is cleaned, a line-end bridge problem that can be caused by the residues formed in the trench 350 is avoided.

The pre-cleaning process is performed by using a fluorine-containing gas. The fluorine-containing gas includes tetrafluoromethane ($CF_4$), sulfur hexafluoride ($SF_6$), or nitrogen trifluoride ($NF_3$), other applicable gas or combinations thereof. In some embodiments, the pre-cleaning process is performed for a period of time in a range from about 1 s to about 20 s.

Figure 3D:
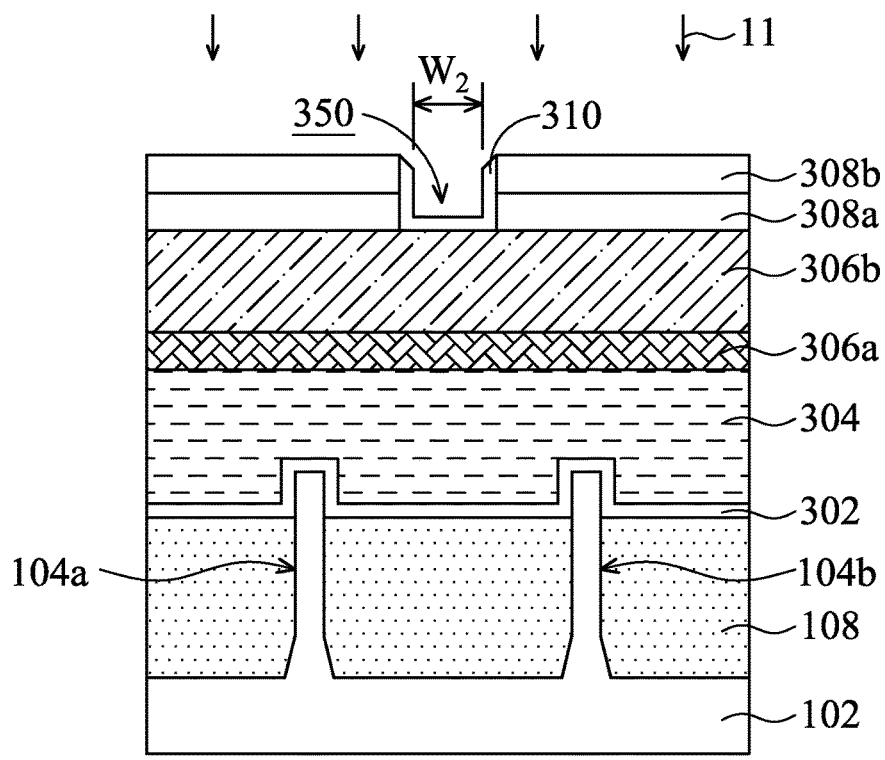

After the coating layer 310 is formed in the trench 350, a first etching process 11 is performed to remove a portion of the coating layer 310 on the second photoresist layer 308b as shown in FIG. 3D, in accordance with some embodiments of the disclosure. In some embodiments, the first etching process 11 is a dry etching process.

It should be noted that the portion of the coating layer 310 on the second photoresist layer 308b is removed, but a portion of the coating layer 310 formed on the sidewall and bottom of the trench 350 remain. The remaining coating layer 310 is used to narrow the width of the trench 350. The top portion of the remaining coating layer 310 on the sidewalls of the trench 350 is slightly etched. Therefore, the top surface of the coating layer 310 is not parallel to the top surface of the second photoresist layer 308b.

Figure 3E:
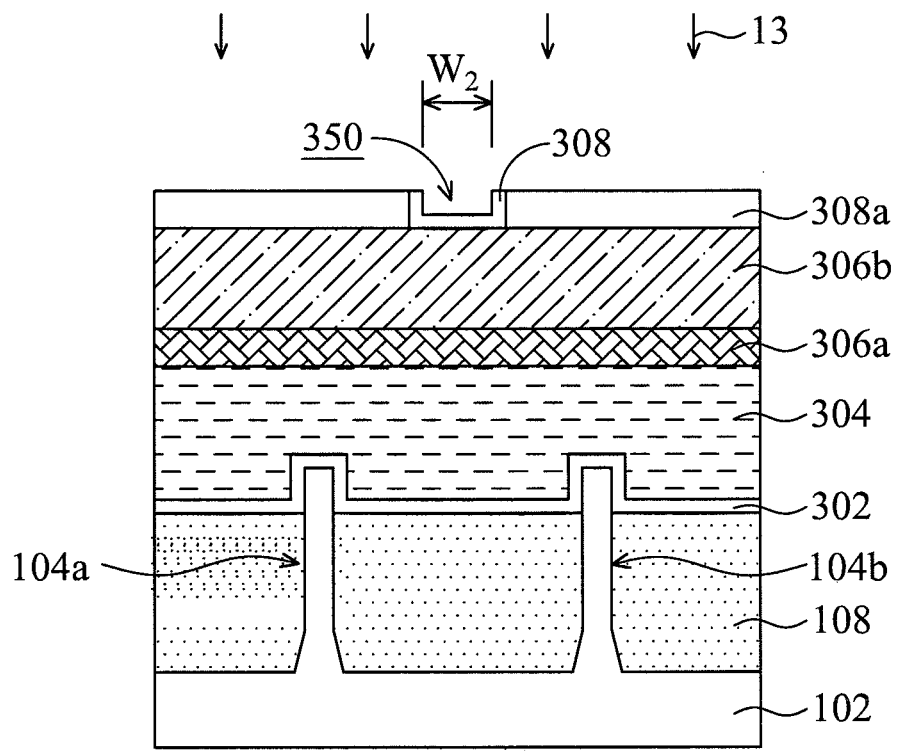

Afterwards, a second etching process 13 is performed to remove a portion of the coating layer 310 and the second photoresist layer 308b as shown in FIG. 3E, in accordance with some embodiments of the disclosure. In some embodiments, the second etching process 13 is also a dry etching process.

Figure 3F:
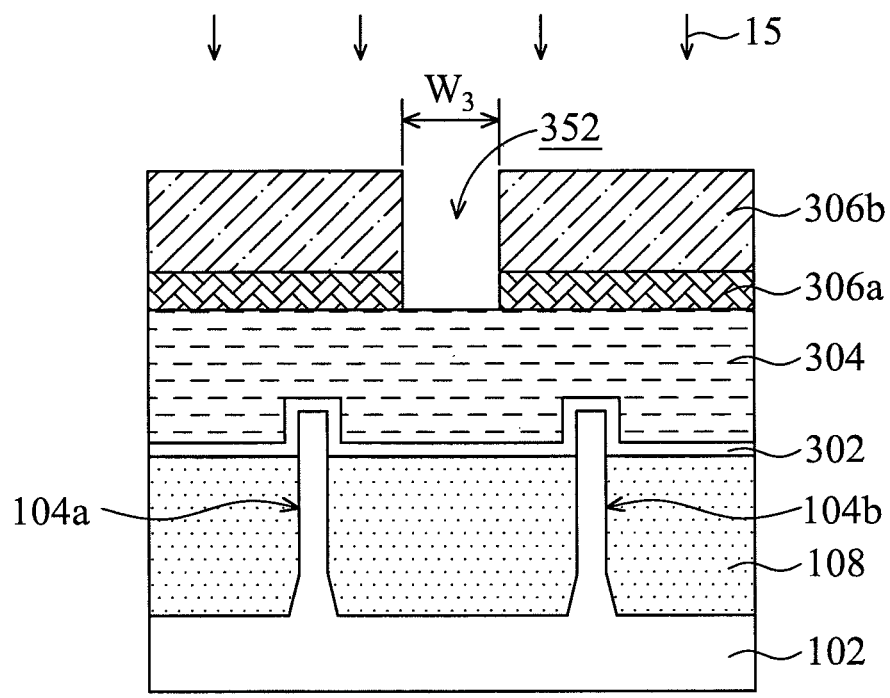

After the second etching process 13, a third etching process 15 is performed to remove the coating layer 310, the second photoresist layer 308b, a portion of the first hard mask layer 306a and a portion of the second hard mask layer 306b as shown in FIG. 3F, in accordance with some embodiments of the disclosure. In some embodiments, the third etching process 15 is a dry etching process.

It should be noted that the bottom of the trench 350 is selectively etched by the third etching process 15. In addition, the portion of the second hard mask layer 306b directly under the coating layer 310 is etched afterwards to expose the portion of the first hard mask layer 306a. Afterwards, the exposed first hard mask layer 306a is removed. The first hard mask layer 306a is an etching stop layer.

As a result, as shown in FIG. 3F, the first hard mask layer 306a and the second hard mask layer 306b are patterned to form a trench 352. The trench 352 has a third width $W_3$. The third width $W_3$ is slightly larger than the second width $W_2$, and the third width $W_3$ is still smaller than the first width $W_1$. In some embodiments, the third width $W_3$ is in a range from about 10 nm to about 50 nm.

Figure 3G:
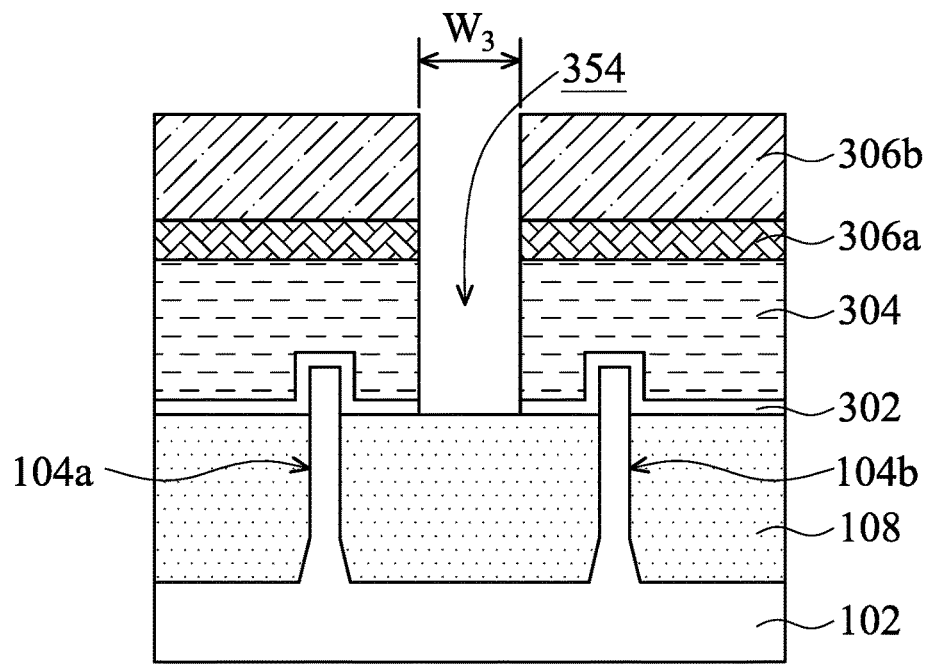

After the trench 352 is formed, the dielectric layer 302 and the polysilicon layer 304 are patterned by using the first hard mask layer 306a and the second hard mask layer 306b as a mask as shown in FIG. 3G, in accordance with some embodiments of the disclosure. As a result, a trench 354 is formed in the polysilicon layer 304. In other words, the trench 354 is called as an end-to-end gap.

Figure 3H:
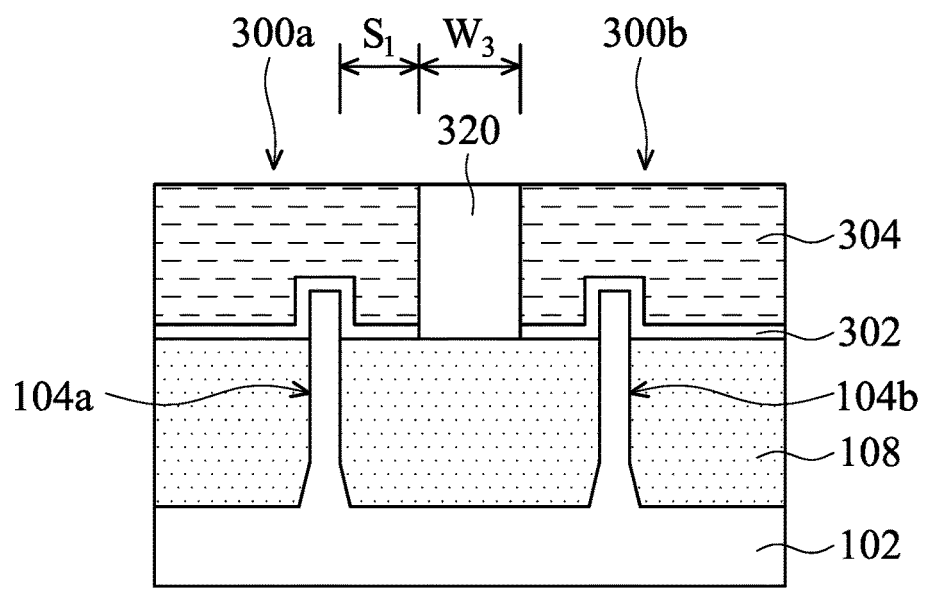

Afterwards, the first hard mask layer 306a and the second hard mask layer 306b are removed, and a dielectric material is filled into the trench 354 (or called end-to-end gap) and on the polysilicon layer 304 as a mask as shown in FIG. 3H, in accordance with some embodiments of the disclosure.

After dielectric material is filled, a portion of dielectric material out of trench 354 is removed by a planarizing process, such as a chemical mechanical polishing process (CMP). As a result, an inter-layer dielectric (ILD) structure 320 is formed.

Figure 3I:
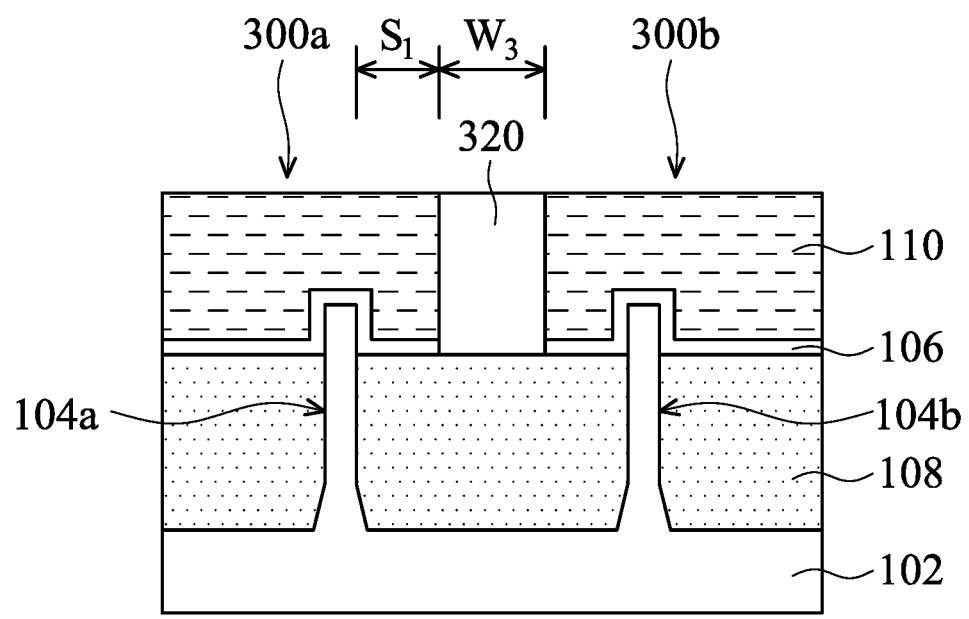

Afterwards, the polysilicon layer 304 and the dielectric layer 302 are removed, and the gate dielectric layer 106 and the gate electrode 110 are formed on the fin structure 104 as shown in FIG. 3I, in accordance with some embodiments of the disclosure. In some embodiments, the gate dielectric layer 106 is a high dielectric constant (high-k) dielectric layer, and the gate electrode 110 is metal gate electrode. In other words, a HK/MG stack structure is formed on the fin structure 104.

The metal gate electrode includes n-type work function metal or p-type work function metal. The n-type work function metal includes tungsten (W), copper (Cu), titanium (Ti), silver (Ag), aluminum (Al), titanium aluminum alloy (TiAl), titanium alumina nitride (TiAlN), tantalum carbide (TaC), tantalum carbon nitride (TaCN), tantalum silicon nitride (TaSiN), manganese (Mn), or zirconium (Zr). The p-type work function metal includes titanium nitride (TiN), tungsten nitride (WN), tantalum nitride (TaN), or ruthenium (Ru). The metal gate is formed by a physical vapor deposition (PVD) process, a chemical vapor deposition (CVD) process, a plating process, an electroless plating process or another applicable process.

On the left side of the ILD structure 320, the first transistor 300a is constructed by the gate dielectric layer 106, the gate electrode 110, and a source/drain (not shown). On the right side of the ILD structure 320, the second transistor 300b is constructed by the gate dielectric layer 106, the gate electrode 110, and another source/drain (not shown). The first transistor 300a and the second transistor 300b are on opposite sidewalls of the ILD structure 316. In some embodiments, the first transistor 300a is an n-type Metal-Oxide-Semiconductor Field-Effect-Transistor (NMOSFET), and the second transistor 300b is a p-type Metal-Oxide-Semiconductor Field-Effect-Transistor (PMOSFET).

As shown in FIG. 3I, a sidewall of the ILD structure 320 has a bottom portion and a top portion, the gate dielectric layer 106 covers the bottom portion of the sidewall of the ILD structure 320, and the gate electrode 110 covers the top portion of the sidewall of the ILD structure 320.

In some embodiments, the ILD structure 320 has a third width $W_3$ in a range from about 20 nm to about 40 nm. In other words, the end-to-end critical dimension (CD) between the first transistor 300a and the second transistor 300b is defined by the third width $W_3$.

In some embodiments, an end cap distance ($S_1$) between the sidewall of ILD structure 320 and a sidewall of first fin structure 104a is in a range from about 0.01 nm to about 50 nm.

It should be noted that as the size of the fin field effect transistor (FinFET) device structure 100 is decreased, controlling the end-to-end critical dimension (CD) becomes more difficult. Therefore, the disclosure uses the coating layer to control the end-to-end critical dimension (CD).

The coating layer 310 is used to reduce the width of the trench 350 from the first width $W_1$ to the second width $W_2$. By using the smaller second width $W_2$, a trench 354 is obtained in the polysilicon layer 304 that has a third width $W_3$ that is smaller than its first width $W_1$. Therefore, the smaller end-to-end critical dimension (CD) (such as the third width $W_3$ in FIG. 3H) is achieved. In addition, the profile of the polysilicon layer 304 is more vertical.

In addition, when the end-to-end critical dimension (CD) (such as the third width $W_3$ in FIG. 3H) is smaller, the end cap distance ($S_1$) becomes larger. A larger end cap distance ($S_1$) is beneficial for forming HK/MG stack structure.

FIGS. 4A-4F show cross-sectional representations of various stages of forming a fin field effect transistor (FinFET) device structure 100, in accordance with some embodiments of the disclosure. FIGS. 4A-4F are cross-sectional representations taken along BB' line of FIG. 2.

Figure 4A:
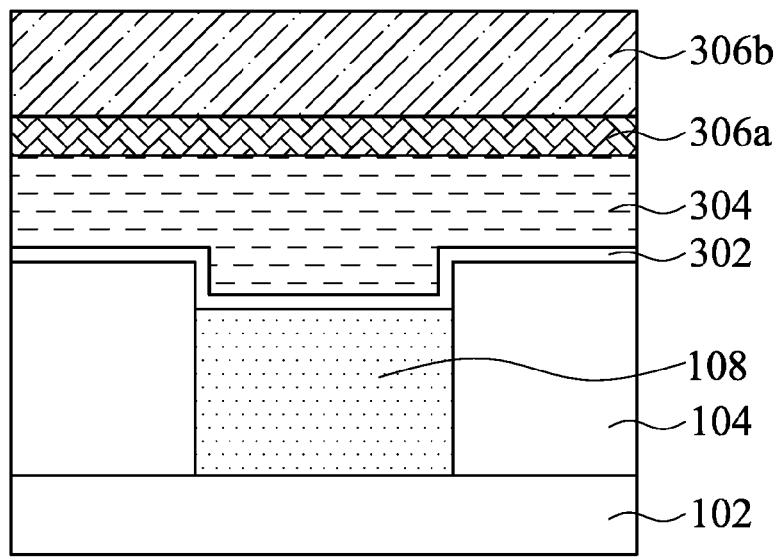
FIGS. 4A-4G show cross-sectional representations of various stages of forming a fin field effect transistor (FinFET) device structure, in accordance with some embodiments of the disclosure.

Referring to FIG. 4A, the fin structure 104 and the isolation structure 108 are formed on the substrate 102. A portion of the fin structure 104 protrudes above the isolation structure 108. The dielectric layer 302 and the polysilicon layer 304 are sequentially formed on the fin structure 104 and the isolation structure 108. Afterwards, the first hard mask layer 306a and the second hard mask layer 306b are formed over the polysilicon layer 304.

Figure 4B:
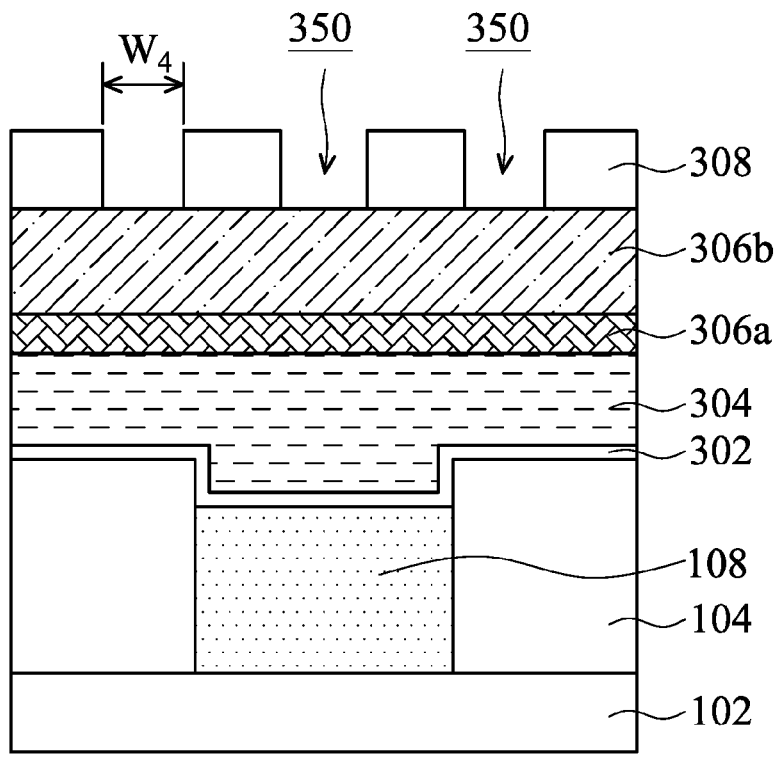

After the second hard mask layer 306b is formed, the photoresist layer 308 is formed on the second hard mask layer 360b as shown in FIG. 4B, in accordance with some embodiments of the disclosure. The photoresist layer 308 is a single layer or multiple layers.

Afterwards, the photoresist layer 308 is patterned to form the trench 350 in the photoresist layer 308. One or more trenches 350 may be formed. The number of the trenches 350 may be adjusted according to the actual application. The trench 350 has a fourth width $W_4$. In some embodiments, the fourth width $W_4$ is in a range from about 40 nm to about 80 nm.

Figure 4C:
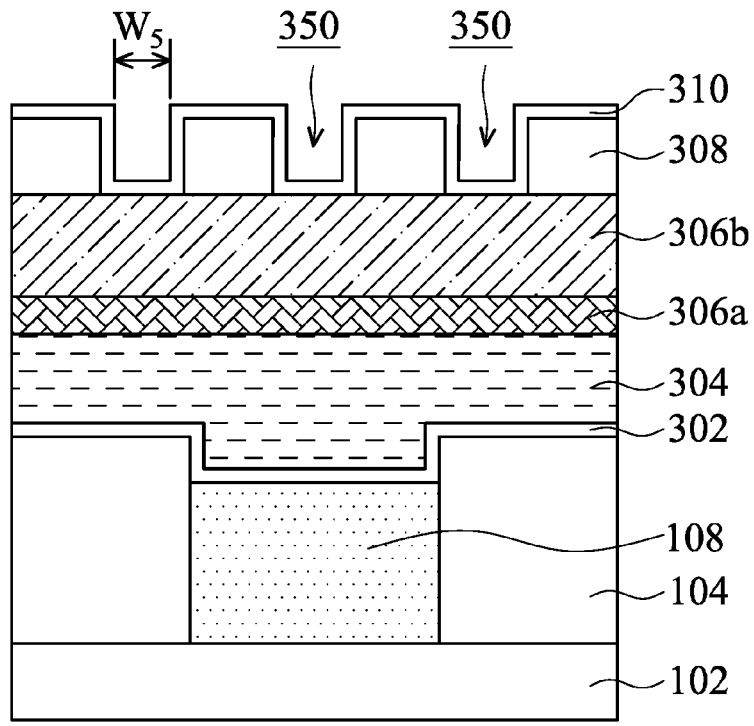

After the trench 350 is formed in the photoresist layer 308, the coating layer 310 is conformally formed in the trench 350 and on the photoresist layer 308 as shown in FIG. 4C, in accordance with some embodiments of the disclosure.

The coating layer 310 is a fluorine-containing polymer. The coating layer 310 is configured to reduce the width of the trench 350. After forming the coating layer 310, the trench 350 has a reduced fifth width $W_2$. Therefore, the fifth width $W_5$ is smaller than the fourth width $W_4$.

In some embodiments, the coating layer 350 is formed by a plasma process with a coating gas. The coating gas includes a fluorine-containing gas, such as tetrafluoromethane ($CF_4$), difluoromethane ($CH_2F_2$), sulfur hexafluoride ($SF_6$), or nitrogen trifluoride ($NF_3$), another applicable gas, or combinations thereof.

Figure 4D:
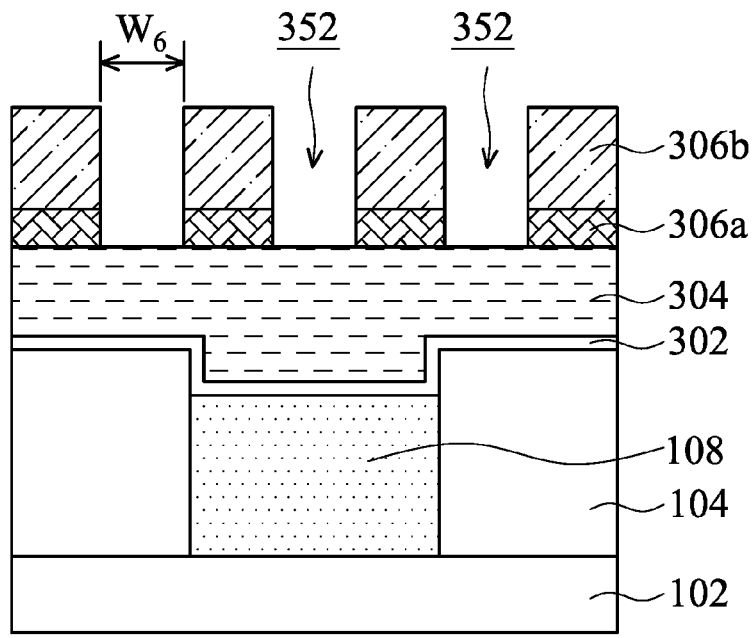

After the coating layer 310 is formed, the photoresist layer 308, the coating layer 310, a portion of the first hard mask layer 306a and a portion of the second hard mask layer 306b are etched by a number of etching processes as shown in FIG. 4D, in accordance with some embodiments of the disclosure. As a result, one or more trenches 352 are formed in the first hard mask layer 306a and the second hard mask layer 306b. The trench 352 has a fifth width $W_5$ which is slightly larger than the fifth width $W_5$.

Figure 4E:
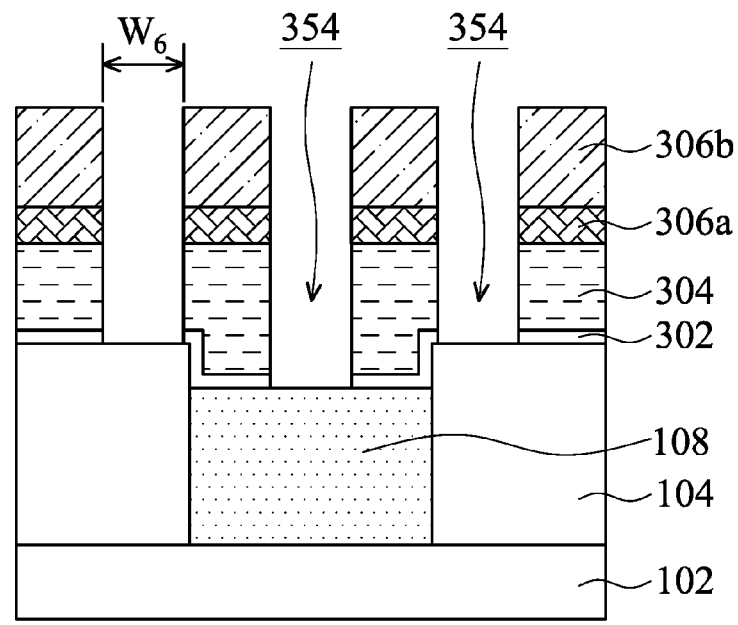

Afterwards, the dielectric layer 302 and the polysilicon layer 304 are patterned by using the first hard mask layer 306a and the second hard mask layer 306b as a mask as shown in FIG. 4E, in accordance with some embodiments of the disclosure. As a result, a trench 354 (or called an end-to-end gap) is formed in the polysilicon layer 304.

Figure 4F:
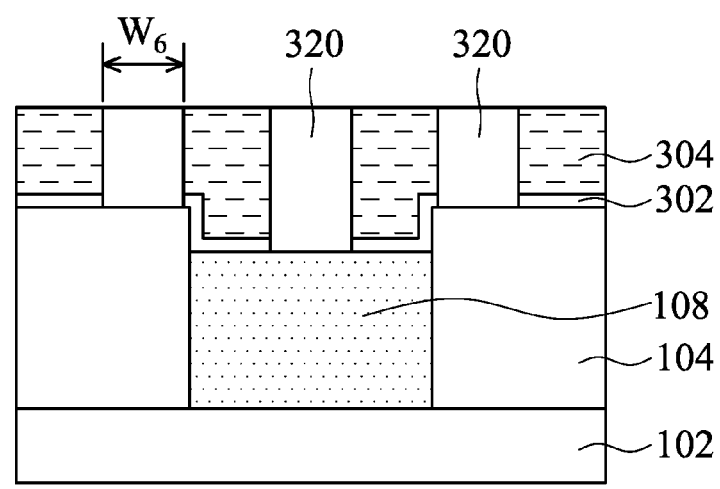

Afterwards, the first hard mask layer 306a and the second hard mask layer 306b are removed, and a dielectric material is filled into the trench 354 and on the polysilicon layer 304 as a mask as shown in FIG. 4F, in accordance with some embodiments of the disclosure.

After the trench 354 is filled, a portion of the excess dielectric material out of the trench 354 is removed by a planarizing process, such as a chemical mechanical polishing process (CMP). As a result, an inter-layer dielectric (ILD) structure 320 is formed.

Figure 4G:
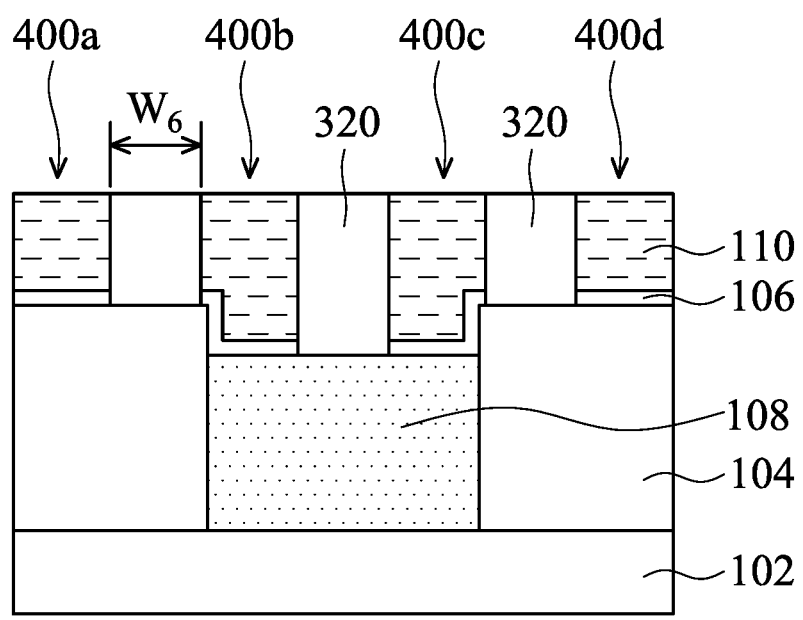

Afterwards, the polysilicon layer 304 and the dielectric layer 302 are removed, and the gate dielectric layer 106 and the gate electrode 110 are formed on the fin structure 104 as shown in FIG. 4G, in accordance with some embodiments of the disclosure. In some embodiments, the gate dielectric layer 106 is a high dielectric constant (high-k) dielectric layer, and the gate electrode 110 is metal gate electrode. In other words, a HK/MG stack structure is formed on the fin structure 104.

As shown in FIG. 4G, the gate dielectric layer 106 and the gate electrode 110 are divided into four parts, and a first transistor 400a, a second transistor 400b, a third transistor 400c and a fourth transistor 400d are formed respectively. A first transistor 400a is constructed by the gate dielectric layer 106 and the gate electrode 110, and a second transistor 400a is constructed by the gate dielectric layer 106 and the gate electrode 110.

The ILD structure 320 is located between the first transistor 400a and the second transistor 400b. In addition, the ILD structure 320 is located between the third transistor 400c and the fourth transistor 400d.

In some embodiments, the sixth width ($W_6$) between the first transistor 400a and the second transistor 400b is in a range from about 10 nm to about 50 nm. In other words, the end-to-end critical dimension (CD) between two transistors is defined by the sixth width $W_6$.

It should be noted that the patterned photoresist layer 308 has a trench 350 with a fourth width $W_4$, and the trench 350 has a reduced fifth width $W_5$ after forming the coating layer 310 in the trench 350. The patterned photoresist layer 308 is used to pattern the underlying first hard mask layer 306a and the second hard mask layer 306b. Once the trench 350 has a reduced fifth width $W_5$, the trench 352 formed in the first hard mask layer 306a and the second hard mask layer 306b also have a reduced sixth width $W_6$. Afterwards, the trench 354 also has a reduced sixth with $W_6$ compared to the original fourth width $W_4$ of the trench 350. Therefore, the end-to-end critical dimension (CD) (or the fifth width $W_6$) is controlled by adjusting the thickness of the coating layer 310. Furthermore, because the polysilicon layer 304 is selectively etched by the above mentioned etching process (such as the third etching process 15), the profile the polysilicon layer 304 is more vertical.

Embodiments for forming fin field effect transistor (FinFET) device structure are provided. A first fin structure and a second fin structure are formed on a substrate. A first transistor is formed on the first fin structure and a second transistor is formed on the second fin structure. An inter-layer dielectric (ILD) structure is formed between the first transistor and the second transistor. An end-to-end critical dimension (CD) between the first transistor and the second transistor is defined by the width of the ILD structure. The width of the ILD structure is defined by a first trench formed in the ILD structure, and the first trench is indirectly defined by a second trench in a photoresist layer which is formed on the hard mask layers and the fin structures. By forming a coating layer in the second trench, the width of the second trench is reduced, and thus the width of the ILD structure is indirectly reduced. Therefore, the end-to-end critical dimension (CD) is well controlled by adjusting the coating thickness of the coating layer.

Furthermore, because the end-to-end critical dimension is reduced, the end cap distance is large enough to form a HK/MG structure. In addition, a vertical profile of gate structure is obtained. Furthermore, before forming the coating layer, a pre-cleaning process is performed to the second trench to remove residue, and therefore a line-end bridge problem is avoided.

In some embodiments, a fin field effect transistor (FinFET) device structure is provided. The FinFET device structure includes a substrate and a first fin structure and a second fin structure extending above the substrate. The FinFET device structure also includes a first transistor formed on the first fin structure and a second transistor formed on the second fin structure. The FinFET device structure further includes an inter-layer dielectric (ILD) structure formed in an end-to-end gap between the first transistor and the second transistor, and the end-to-end gap has a width in a range from about 10 nm to about 50 nm.

In some embodiments, a fin field effect transistor (FinFET) device structure is provided. The FinFET device structure includes a substrate and an isolation structure formed on the substrate. The FinFET device structure also includes a first fin structure embedded in the isolation structure and a first transistor formed on the first fin structure. The FinFET device structure further includes a second transistor formed on the first fin structure and the isolation structure. The FinFET device structure includes an inter-layer dielectric (ILD) structure formed in an end-to-end gap between the first transistor and the second transistor, and the end-to-end gap has a width in a range from about 10 nm to about 50 nm.

In some embodiments, a method for forming a fin field effect transistor device structure is provided. The method includes providing a substrate and forming a first fin structure and a second fin structure extending above the substrate. The method also includes forming a dielectric layer on the first fin structure and the second fin structure and forming a polysilicon layer, a hard mask layer and a photoresist layer on the dielectric layer. The method also includes patterning the photoresist layer to form a first trench in the photoresist layer, and the first trench has a first width. The method includes conformally forming a coating layer in the first trench to form a second trench in the photoresist layer, and the second trench has a second width and the second width is smaller than the first width. The method further includes patterning the hard mask layer by using the photoresist layer as a mask and patterning the polysilicon layer by using the hard mask as a mask to form an end-to-end gap between the first fin structure and a second fin structure. The end-to-end gap has a third width, and the third width is smaller than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a substrate;
    forming a first fin structure and a second fin structure extending from the substrate by etching a portion of the substrate;
    forming a dielectric layer on the first fin structure and the second fin structure;
    forming a polysilicon layer, a hard mask layer and a photoresist layer on the dielectric layer;
    patterning the photoresist layer to form a first trench in the photoresist layer, wherein the first trench has a first width;
    conformally forming a coating layer in the first trench to form a second trench in the photoresist layer, wherein the second trench has a second width and the second width is smaller than the first width;
    patterning the hard mask layer by using the photoresist layer as a mask;
    patterning the polysilicon layer by using the hard mask as a mask to form an end-to-end gap between the first fin structure and a second fin structure, wherein the end-to-end gap has a third width, and the third width is smaller than the first width.

2. The method for forming the fin field effect transistor (FinFET) device structure as claimed in claim 1, further comprising:
    forming an inter-layer dielectric (ILD) structure in the end-to-end gap.

3. The method for forming the fin field effect transistor (FinFET) device structure as claimed in claim 1, wherein the third width is in a range from about 10 nm to about 50 nm.

4. The method for forming the fin field effect transistor (FinFET) device structure as claimed in claim 1, further comprising:
    cleaning the photoresist layer by a fluorine-containing gas before forming the coating layer in the first trench.

5. The method for forming the fin field effect transistor (FinFET) device structure as claimed in claim 4, wherein the fluorine-containing gas comprises tetrafluoromethane ($CF_4$), sulfur hexafluoride ($SF_6$), nitrogen trifluoride ($NF_3$), or combinations thereof.

6. The method for forming the fin field effect transistor (FinFET) device structure as claimed in claim 1, wherein forming the photoresist layer comprises:
    forming a first photoresist layer on the hard mask layer, wherein the first photoresist layer is a carbon-rich layer; and
    forming a second photoresist layer on the first photoresist layer, wherein the second photoresist layer is a silicon-rich layer.

7. The method for forming the fin field effect transistor (FinFET) device structure as claimed in claim 1, wherein forming the coating layer in the first trench comprises using a coating process, and the coating process is performed by using a fluorine-containing gas.

8. The method for forming the fin field effect transistor (FinFET) device structure as claimed in claim 7, wherein a coating time of the coating process is in a range from about 1 second to about 50 seconds.

9. The method for forming the fin field effect transistor (FinFET) device structure as claimed in claim 1, wherein forming the hard mask layer comprises:
forming a first hard mask layer on the polysilicon layer; and
forming a second hard mask layer on the first hard mask layer.

10. A method for forming the fin field effect transistor (FinFET) device structure, comprising:
forming a first fin structure and a second fin structure extending from a substrate by etching a portion of the substrate;
forming a polysilicon layer and a photoresist layer over the first fin structure and the second fin structure;
patterning the photoresist layer to form a first trench in the photoresist layer, wherein the first trench has a first width;
conformally forming a coating layer in the first trench to form a second trench in the photoresist layer, wherein the second trench has a second width and the second width is smaller than the first width; and
patterning the polysilicon layer by using the photoresist layer as a mask to form an end-to-end gap between the first fin structure and a second fin structure, wherein the end-to-end gap has a third width, and the third width is smaller than the first width.

11. The method for forming the fin field effect transistor (FinFET) device structure as claimed in claim 10, further comprising:
cleaning the photoresist layer by a fluorine-containing gas before forming the coating layer in the first trench.

12. The method for forming the fin field effect transistor (FinFET) device structure as claimed in claim 11, wherein the fluorine-containing gas comprises tetrafluoromethane ($CF_4$), sulfur hexafluoride ($SF_6$), nitrogen trifluoride ($NF_3$), or combinations thereof.

13. The method for forming the fin field effect transistor (FinFET) device structure as claimed in claim 10, wherein forming the photoresist layer comprises:
forming a first photoresist layer on the hard mask layer, wherein the first photoresist layer is a carbon-rich layer; and
forming a second photoresist layer on the first photoresist layer, wherein the second photoresist layer is a silicon-rich layer.

14. The method for forming the fin field effect transistor (FinFET) device structure as claimed in claim 10, further comprising:
forming a hard mask layer between the polysilicon layer and the photoresist layer; and
patterning the hard mask layer by using the photoresist layer as a mask.

15. The method for forming the fin field effect transistor (FinFET) device structure as claimed in claim 10, further comprising:
forming a dielectric layer between the first fin structure, the second fin structure and the polysilicon layer; and
patterning the dielectric layer after patterning the polysilicon layer.

16. The method for forming the fin field effect transistor (FinFET) device structure as claimed in claim 10, further comprising:
forming an inter-layer dielectric (ILD) structure in the end-to-end gap.

17. The method for forming the fin field effect transistor (FinFET) device structure as claimed in claim 10, wherein forming the coating layer in the first trench comprises using a coating process, and the coating process is performed by using a fluorine-containing gas.

18. A method for forming a fin field effect transistor (FinFET) device structure, comprising:
forming a first fin structure and a second fin structure extending from a substrate by etching a portion of the substrate;
forming a polysilicon layer and a photoresist layer over the first fin structure and the second fin structure, wherein the photoresist layer comprises a first photoresist layer and a second photoresist layer on the first photoresist layer;
patterning the photoresist layer to form a first trench in the first photoresist layer and the second photoresist layer, wherein the first trench has a first width;
conformally forming a coating layer in the first trench to form a second trench in the photoresist layer, wherein the second trench has a second width and the second width is smaller than the first width; and
removing a portion of the coating layer to expose a top surface of the second photoresist layer, wherein a top surface of the coating layer is not parallel to the top surface of the second photoresist layer;
removing the second photoresist layer to expose a top surface of the first photoresist layer;
patterning the polysilicon layer by using the first photoresist layer as a mask to form an end-to-end gap between the first fin structure and a second fin structure, wherein the end-to-end gap has a third width, and the third width is smaller than the first width.

19. The method for forming the fin field effect transistor (FinFET) device structure as claimed in claim 18, wherein forming the coating layer in the first trench comprises using a coating process, and the coating process is performed by using a fluorine-containing gas.

20. The method for forming the fin field effect transistor (FinFET) device structure as claimed in claim 18, further comprising:
cleaning the photoresist layer by a fluorine-containing gas before forming the coating layer in the first trench.

* * * * *